US012568750B2

(12) United States Patent
Sun

(10) Patent No.: US 12,568,750 B2
(45) Date of Patent: Mar. 3, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jiajia Sun, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 205 days.

(21) Appl. No.: 17/623,232

(22) PCT Filed: Dec. 21, 2021

(86) PCT No.: PCT/CN2021/140233
§ 371 (c)(1),
(2) Date: Dec. 27, 2021

(87) PCT Pub. No.: WO2023/108737
PCT Pub. Date: Jun. 22, 2023

(65) Prior Publication Data
US 2024/0032400 A1 Jan. 25, 2024

(30) Foreign Application Priority Data

Dec. 13, 2021 (CN) .......................... 202111521776.4

(51) Int. Cl.
*H10K 59/80* (2023.01)
*H10K 59/40* (2023.01)
(52) U.S. Cl.
CPC ........... *H10K 59/879* (2023.02); *H10K 59/40* (2023.02)

(58) Field of Classification Search
None
See application file for complete search history.

(56) References Cited

U.S. PATENT DOCUMENTS

2015/0062515 A1 3/2015 Tomioka
2019/0067394 A1 2/2019 Cheon
(Continued)

FOREIGN PATENT DOCUMENTS

CN 110148617 A 8/2019
CN 111599850 A 8/2020
(Continued)

OTHER PUBLICATIONS

Chinese Office Action issued in corresponding Chinese Patent Application No. 202111521776.4 dated Dec. 16, 2022, pp. 1-7.
(Continued)

*Primary Examiner* — Erik T. K. Peterson
(74) *Attorney, Agent, or Firm* — PV IP PC; Peter Stecher; Wei Te Chung

(57) ABSTRACT

A display panel and a display device are provided. The display panel further includes a low refractive index layer and a high refractive index layer. The low refractive index layer is defined with a plurality of openings located in a display area and a first groove located in a non-display area. A side of the high refractive index layer away from the low refractive index layer has a protrusion. A distance from the first groove to a top of the protrusion along a first direction is greater than a shortest distance from the first groove to the plurality of openings in the first direction, and wherein the first direction is defined as a direction from the non-display area to the display area.

16 Claims, 6 Drawing Sheets

(56) References Cited

U.S. PATENT DOCUMENTS

2021/0367212 A1 * 11/2021 Kim ...................... H10K 59/12
2022/0093895 A1 * 3/2022 Zhang ................. H10K 59/122

FOREIGN PATENT DOCUMENTS

| CN | 111613628 A | 9/2020 |
|---|---|---|
| CN | 112885879 A | 6/2021 |
| CN | 113141779 A | 7/2021 |
| CN | 113178536 A | 7/2021 |
| CN | 113314692 A | 8/2021 |
| CN | 113394242 A | 9/2021 |
| CN | 113725259 A | 11/2021 |

OTHER PUBLICATIONS

International Search Report in International application No. PCT/CN2021/140233, mailed on Sep. 15, 2022.
Written Opinion of the International Searching Authority in International application No. PCT/CN2021/140233, mailed on Sep. 15, 2022.

* cited by examiner

DISPLAY PANEL AND DISPLAY DEVICE

CROSS REFERENCE TO RELATED APPLICATIONS

This application is a U.S. national phase application of International Application No. PCT/CN2021/140233, filed on Dec. 21, 2021, which claims priority to and the benefit of Chinese Patent Application No. 202111521776.4, filed on Dec. 13, 2021. The disclosures of the aforementioned applications are incorporated herein by reference in their entireties.

FIELD OF INVENTION

This application relates to a field of display technology, and particularly relate to a display panel and a display device.

BACKGROUND OF INVENTION

Compared with traditional liquid crystal display (LCD), organic light-emitting diode (OLED) display panels have advantages of lighter weight, wide viewing angles, fast response times, low temperature resistance, and high luminous efficiency. Therefore, it has always been regarded as a next generation of a new display technology in display industry. In particular, the OLED display panel can form a bendable flexible display screen on a flexible substrate, which is a huge advantage of the OLED display panel.

Currently, in order to reduce power consumption and improve efficiency of OLED display panels, display panel manufacturers continue to introduce new technologies. With a help of geometrical optics, by arranging a microlens pattern (MLP) in an OLED screen, the more divergent light emitted by the OLED screen is concentrated directly above the OLED screen, which is one of effective methods to improve a light output efficiency of the OLED display panel.

The microlens pattern in the MLP technology usually requires an inkjet printing (IJP) process to prepare and make it flat to facilitate subsequent processes. However, the IP process needs to provide retaining walls or slits around the screen in advance to block a flow of ink and limit the coverage of the ink. Therefore, how to design the retaining walls or slit becomes a key point to improve the yield of the microlens pattern display panel and effectively limit the coverage of the ink to achieve a narrow border display.

Technical Problem

Embodiments of the present application provides a display panel and a display device, which can ensure that flat portions of the high refractive index layer are all located in the display area, and limit the coverage of the high refractive index layer to achieve a narrow border display.

SUMMARY OF INVENTION

An embodiment of the present application provides a display panel including a display area and a non-display area located on at least one side of the display area. The display panel further includes: a substrate; a light-emitting layer disposed on a side of the substrate, wherein the light-emitting layer includes a plurality of light-emitting parts arranged in the display area; a low refractive index layer disposed on a side of the light-emitting layer away from the substrate, wherein the low refractive index layer is defined with a plurality of openings distributed in an array in the display area and corresponding to the plurality of light-emitting parts, and the low refractive index layer is defined with first grooves distributed in the non-display area; and a high refractive index layer disposed on a side of the low refractive index layer away from the substrate, wherein the high refractive index layer fills the plurality of openings, wherein a refractive index of the high refractive index layer is greater than a refractive index of the low refractive index layer, and the high refractive index layer has a protrusion on a side away from the low refractive index layer; wherein the plurality of openings comprises a first opening closest to the first groove, a distance from the first groove to a top of the protrusion along a first direction is greater than a distance from the first groove to the first opening along the first direction, and wherein the first direction is defined as a direction from the non-display area to the display area.

In an embodiment of the present application, the protrusion is disposed in the display area, and an orthographic projection of the protrusion on the substrate at least partially overlap an orthographic projection of the first opening on the substrate, or the protrusion is disposed on a side of the first opening away from the non-display area.

In an embodiment of the present application, a thickness of the high refractive index layer at the protrusion is greater than a thickness of a part of the high refractive index layer other than the protrusion.

In an embodiment of the present application, the high refractive index layer covers the first groove, or a boundary of the high refractive index layer is located between the first groove and the display area.

In an embodiment of the present application, the high refractive index layer further includes a second groove, and the second groove is defined on a side of the first groove away from the display area. The high refractive index layer covers the second groove, or the boundary of the high refractive index layer is located between the second groove and the display area.

In an embodiment of the present application, the non-display area includes: a bending sub-area configured to be bendable, wherein the first groove is defined between the display area and the bending sub-area.

In an embodiment of the present application, both ends of the first groove extend to a boundary of the display panel and are in contact with the boundary of the display panel.

In an embodiment of the present application, the high refractive index layer further includes: a retaining wall structure disposed between the first groove and the second groove; wherein the high refractive index layer covers the retaining wall structure, or a boundary of the high refractive index layer is located between the retaining wall structure and the display area.

In an embodiment of the present application, the high refractive index layer includes a first part and a second part connected to both sides of the protrusion, the first part is located in the display area, and the second part extends to the non-display area, wherein a distance between a top surface of the second part and the low refractive index layer decreases in a direction from the protrusion to the non-display area, and a distance between the top surface of the second part and the low refractive index layer is greater than a distance between a top surface of the first part and the low refractive index layer.

In an embodiment of the present application, a side of the first part close to the low refractive index layer is filled in the plurality of openings, and a surface of the first part away from the low refractive index layer is a flat surface.

In an embodiment of the present application, a length of the first groove in the first direction is greater than a length of each of the plurality of openings in the first direction.

According to the above object of the present application, a display device is provided, the display device includes the display panel, and the display panel includes a display area and a non-display area located on at least one side of the display area. The display panel further includes: a substrate; a light-emitting layer disposed on a side of the substrate, wherein the light-emitting layer includes a plurality of light-emitting parts arranged in the display area; a low refractive index layer disposed on a side of the light-emitting layer away from the substrate, wherein the low refractive index layer is defined with a plurality of openings distributed in an array in the display area and corresponding to the plurality of light-emitting parts, and the low refractive index layer is defined with first grooves distributed in the non-display area; and a high refractive index layer disposed on a side of the low refractive index layer away from the substrate, wherein the high refractive index layer fills the plurality of openings, and wherein a refractive index of the high refractive index layer is greater than a refractive index of the low refractive index layer, and the high refractive index layer has a protrusion on a side away from the low refractive index layer; wherein the plurality of openings includes a first opening closest to the first groove, a distance from the first groove to a top of the protrusion along a first direction is greater than a distance from the first groove to the first opening along the first direction, and wherein the first direction is defined as a direction from the non-display area to the display area.

In an embodiment of the present application, the protrusion is disposed in the display area, and an orthographic projection of the protrusion on the substrate at least partially overlap an orthographic projection of the first opening on the substrate, or the protrusion is disposed on a side of the first opening away from the non-display area.

In an embodiment of the present application, a thickness of the high refractive index layer at the protrusion is greater than a thickness of a part of the high refractive index layer other than the protrusion.

In an embodiment of the present application, the high refractive index layer covers the first groove, or a boundary of the high refractive index layer is located between the first groove and the display area.

In an embodiment of the present application, the high refractive index layer further includes a second groove, and the second groove is defined on a side of the first groove away from the display area, and wherein the high refractive index layer covers the second groove, or the boundary of the high refractive index layer is located between the second groove and the display area.

In an embodiment of the present application, the non-display area includes: a bending sub-area configured to be bendable, wherein the first groove is defined between the display area and the bending sub-area.

In an embodiment of the present application, both ends of the first groove extend to a boundary of the display panel and are in contact with the boundary of the display panel.

In an embodiment of the present application, the high refractive index layer further includes: a retaining wall structure disposed between the first groove and the second groove; wherein the high refractive index layer covers the retaining wall structure, or a boundary of the high refractive index layer is located between the retaining wall structure and the display area.

In an embodiment of the present application, the high refractive index layer includes a first part and a second part connected to both sides of the protrusion, the first part is located in the display area, and the second part extends to the non-display area, wherein a distance between a top surface of the second part and the low refractive index layer decreases in a direction from the protrusion to the non-display area, and a distance between the top surface of the second part and the low refractive index layer is greater than a distance between a top surface of the first part and the low refractive index layer.

Beneficial Effect

Compared with the prior art, in the inkjet printing process, the thickness of ink will gradually increase at an edge where the ink flows to form a film, and after reaching the maximum thickness, it will gradually be reduced so that forming a protrusion on the edge of the film. In the embodiment of the present application, a distance between the top of the protrusion and a first groove is designed to be greater than a distance between a first opening and the first groove, so that the maximum thickness formed by the edge of the film is located on the first opening or a side of the first opening close to a display area. Therefore, it can ensure that flat portions on a side of the protrusion close to the display area are all located in the display area, and the farther the protrusion is from a non-display area, the smaller a coverage area of a high refractive index layer for the non-display area is. This can effectively limit the coverage area of the high refractive index layer, thereby saving the occupied space for the non-display area to achieve a narrow border display.

DESCRIPTION OF DRAWINGS

The detailed description of the specific implementations of the present application with reference to the accompanying drawings will make the technical solutions and other beneficial effects of the present application easier to understand.

DETAILED DESCRIPTION OF PREFERRED EMBODIMENTS

Figure 1:
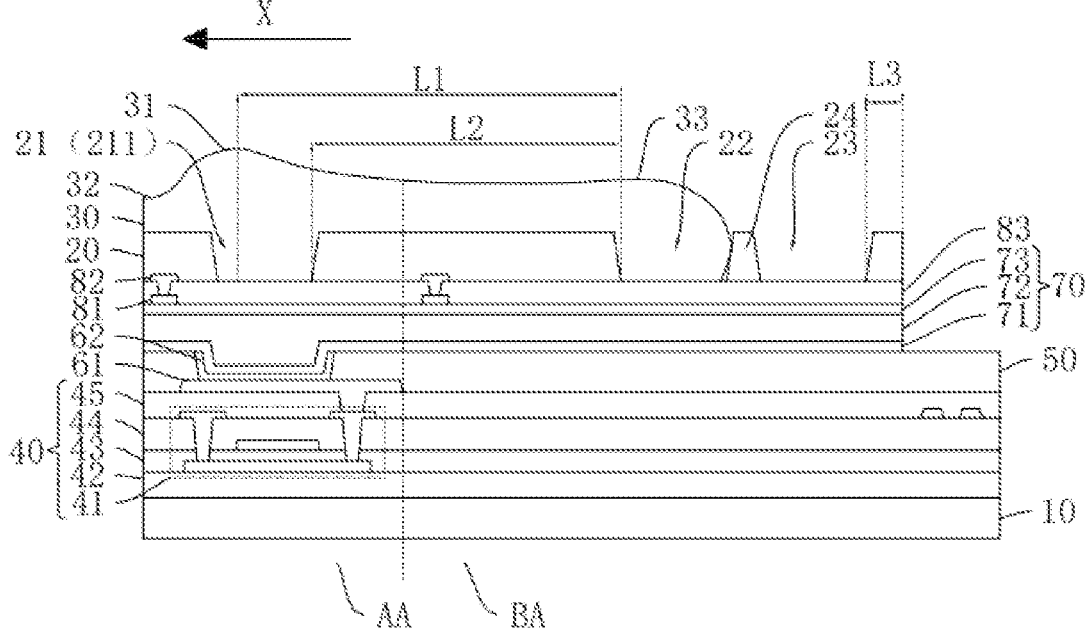
FIG. 1 is a schematic structural diagram of a display panel provided by an embodiment of the application.

The technical solutions in the embodiments of the present application will be clearly described with reference to the drawings in the embodiments of the present application. Obviously, the embodiments are only a part of the embodiments of the present application, rather than all the embodiments. Based on these embodiments in this application, all other embodiments obtained by those skilled in the art without doing creative work shall fall within the protection scope of this application.

The following disclosure provides various embodiments for realizing various structures of the present application. In order to simplify the disclosure of the present application, the components and configurations of specific examples are described below. Certainly, they are only examples and are not intended to limit the present application. In addition, this application may repeat reference numerals and/or reference letters in different examples. This repetition is for the purpose of simplification and clarity and does not indicate the relationship between the various embodiments and/or configurations discussed. In addition, this application provides examples of various processes and materials, but those of ordinary skill in the art may be aware of the application of other processes and/or the use of other materials.

An embodiment of the present application provides a display panel including a display area and a non-display area located on at least one side of the display area.

Furthermore, the display panel further includes a substrate 10, a light-emitting layer, a low refractive index layer 20, and a high refractive index layer 30.

During the application process, the thickness will gradually increase at the edge where the ink flows to form the film during inkjet printing, and then gradually decrease after reaching the maximum thickness so that forming a protrusion 31 on the edge of the film. In the embodiment of the present application, the distance between the top of the protrusion 31 and the first groove 22 is configured to be greater than the distance between the first opening and the first groove so that the maximum thickness formed by the edge of the film is located on the first opening 211 or the side of the first opening 211 close to the display area AA. Furthermore, it can be ensured that the flat portions on the side of the protrusion 31 close to the display area AA are all located in the display area AA, and the farther the protrusion 31 is from the non-display area BA, the smaller a coverage area of a high refractive index layer 30 for the non-display area is. This can save the occupied space in the non-display area BA to achieve a narrow border display.

Specifically, please continue to refer to FIG. 1. In the embodiment of the present application, the display panel includes a display area AA and a non-display area BA located on at least one side of the display area AA. It should be noted that the non-display area BA can be the lower border area of the display panel.

The display panel further includes a substrate 10, a thin film transistor array layer 40 disposed on the substrate 10, a pixel definition layer 50 disposed on the thin film transistor array layer 40, an encapsulation layer 70 disposed on the pixel definition layer 50, a touch layer disposed on the encapsulation layer 70, a low refractive index layer 20 disposed on the touch layer, and a high refractive index layer 30 disposed on the low refractive index layer 20.

Wherein, the thin film transistor array layer 40 includes a thin film transistor device 41 disposed on the substrate 10 and a barrier layer covering the thin film transistor device 41. The barrier layer includes a buffer layer 42 disposed on the substrate 10, a passivation layer 43 disposed on the buffer layer 42, a gate insulating layer 44 disposed on the passivation layer 43, and an interlayer insulating layer 45 disposed on the gate insulating layer 44. The thin film transistor device 41 includes an active layer disposed on the buffer layer 42 and covered by the passivation layer 43, a gate disposed on the passivation layer 43 and covered by the gate insulating layer 44, and a source and a drain disposed on the gate insulating layer 44 and covered by the interlayer insulating layer 45. In addition, a side of the interlayer insulating layer 45 facing away from the substrate 10 is a flat surface, that is, the interlayer insulating layer 45 is also used to be as a planarization layer to facilitate subsequent processes.

The display panel further includes a plurality of anodes 61 arranged on the interlayer insulating layer 45, the pixel defining layer 50 defines a plurality of pixel openings corresponding to the plurality of anodes 61 in one-to-one correspondence, and each pixel opening correspondingly exposes the upper surface of an anode 61. The display panel further includes a light-emitting layer disposed on the pixel definition layer 50, and the light-emitting layer includes a plurality of light-emitting parts 62 disposed on each anode 61 corresponding to each pixel opening.

The encapsulation layer 70 covers the pixel definition layer 50, and continuously covers the plurality of pixel openings and the plurality of light-emitting parts 62, wherein the encapsulation layer 70 includes a first inorganic encapsulation layer 71, a first organic encapsulation layer 72, and a second inorganic encapsulation layer 73 stacked on the pixel definition layer 50.

The touch layer is disposed on the encapsulation layer 70, and the touch layer includes a first touch metal layer 81 and a second touch metal layer 82 disposed on the encapsulation layer 70, and an insulating layer 83 provided between the first touch metal layer 81 and the second touch metal layer 82. Wherein, the touch layer provided in the embodiment of the present application can be a mutual-capacitive type or a self-capacitive type. If the touch layer is mutual capacitance type, the first touch metal layer 81 can include a plurality of first electrodes and a plurality of second electrodes, the plurality of first electrodes are connected by a first connecting bridge located in the first touch metal layer 81, and the plurality of second electrodes are connected by a second connecting bridge located in the second touch metal layer 82 and passing through the insulating layer 83. If the touch layer is a self-capacitive touch layer, the first touch metal layer 81 can include a plurality of touch electrodes distributed in an array, and the second touch metal layer 82 can include a plurality of touch traces, and each touch trace is correspondingly connected to a touch electrode. In addition, if the touch layer is a self-capacitive type touch layer, the touch layer can also include only one metal layer. That is, the metal layer includes a plurality of touch electrodes and a plurality of touch traces located between adjacent touch electrodes, and each touch trace is correspondingly connected to a touch electrode. In addition, the embodiments of the present application only take this as an example but are not limited to this, and the specific type and structure of the touch layer can be selected according to actual needs.

The low refractive index layer 20 is disposed on the touch layer, and the low refractive index layer 20 covers the display area AA and extends to the non-display area BA, wherein the low refractive index layer 20 includes a plurality of openings 21 formed in the display area AA and a first groove 22 formed in the non-display area; The plurality of openings 21 include a first opening 211 closest to the display area BA, that is, among the plurality of openings 21, the first opening 211 is closest to the first groove 22.

It should be noted that the bottom of each opening 21 corresponds to a pixel opening, that is, each opening 21 corresponds to a light-emitting part 62, and the cross-sectional shape of the opening 21 can be an inverted trapezoid.

Further, the high refractive index layer 30 is disposed on the low refractive index layer 20, and the high refractive index layer 30 also covers the display area AA and extends to the non-display area BA. Wherein, the high refractive index layer 30 is filled in the plurality of openings 21 to form a plurality of microlens units at the plurality of openings 21. This can concentrate light on the corresponding light-emitting part 62 and improve the light-emitting effect of the corresponding light-emitting part 62 to improve the light-emitting efficiency of the display panel.

Specifically, the refractive index of the high refractive index layer 30 is greater than the refractive index of the low refractive index layer 20. For example, the refractive index of the low refractive index layer 20 ranges from 1.4 to 1.6, and the material of the low refractive index layer 20 may include a light-transmitting organic material having a low refractive index. For example, acrylic resin, polyimide resin, polyamide resin, and/or Alq3 [tris(8-hydroxyquinoline)aluminum], etc. For another example, the refractive index of the high refractive index layer 30 ranges from 1.61 to 1.8, and the material of the high refractive index layer 30 include a light-transmitting organic material with a high refractive index. For example, poly(3,4-ethylenedioxythiophene) (PEDOT), 4,4'-bis[N-(3-methylphenyl)-N-phenylamino]biphenyl(TPD),4,4',4"-Tris[(3-methylphenyl)phenylamino]triphenylamine(m-MTDATA),1,3,5-Tris[N,N-bis(2-methylphenyl)-amino]benzene(o-MTDAB), 1,3,5-Tris[N, N-bis(3-methylphenyl)-amino]benzene (m-MTDAB), 1,3, 5-Tris[N,N-bis(4-methylphenyl)amino]benzene (p-MTDAB), 4,4'-bis[N,N-bis(3-methylphenyl)-amino]diphenylmethane (BPPM), 4,4'-dicarbazolyl-1,1'-biphenyl (CBP), 4,4',4"-tris(N-carbazole)triphenylamine (TCTA), and 2,2',2"-(1,3,5-benzenetriyl)tris-[1-phenyl-1H-benzimidazole](TPBI) and/or 3-(4-biphenyl)-4-phenyl-5-tert-butylphenyl-1,2,4-triazole (TAZ).

In the embodiments of this application, the high refractive index layer 30 can be prepared by an inkjet printing process. During the ink flow process, due to the influence of surface tension, the thickness at the edge of the ink will gradually increase, and then gradually decrease after reaching the maximum thickness, so that the high refractive index layer 30 forms a protrusion 31 in the display area AA. It can be understood that the high refractive index layer 30 has the largest thickness at the protrusion 31.

Wherein, the high refractive index layer 30 covers the first groove 22, or the boundary of the high refractive index layer 30 is between the first groove 22 and the display area AA. The distance L1 from the first groove 22 to the top of the protrusion 31 along the first direction X is greater than distance L2 from the first groove 22 to the first opening 211 along the first direction X so that the protrusion 31 can be arranged at a position farther away from the first groove 22 to limit the coverage of the high refractive index layer 30. Furthermore, the coverage of the high refractive index layer 30 in the non-display area BA can be effectively controlled, and the occupied space of the non-display area BA can be reduced to realize a narrow border display.

The orthographic projection of the protrusion 31 on the substrate 10 at least partially overlaps the orthographic projection of the first opening 211 on the substrate 10, or the protrusion 31 is located on the side of the first opening 211 away from the non-display area BA.

Figure 2:
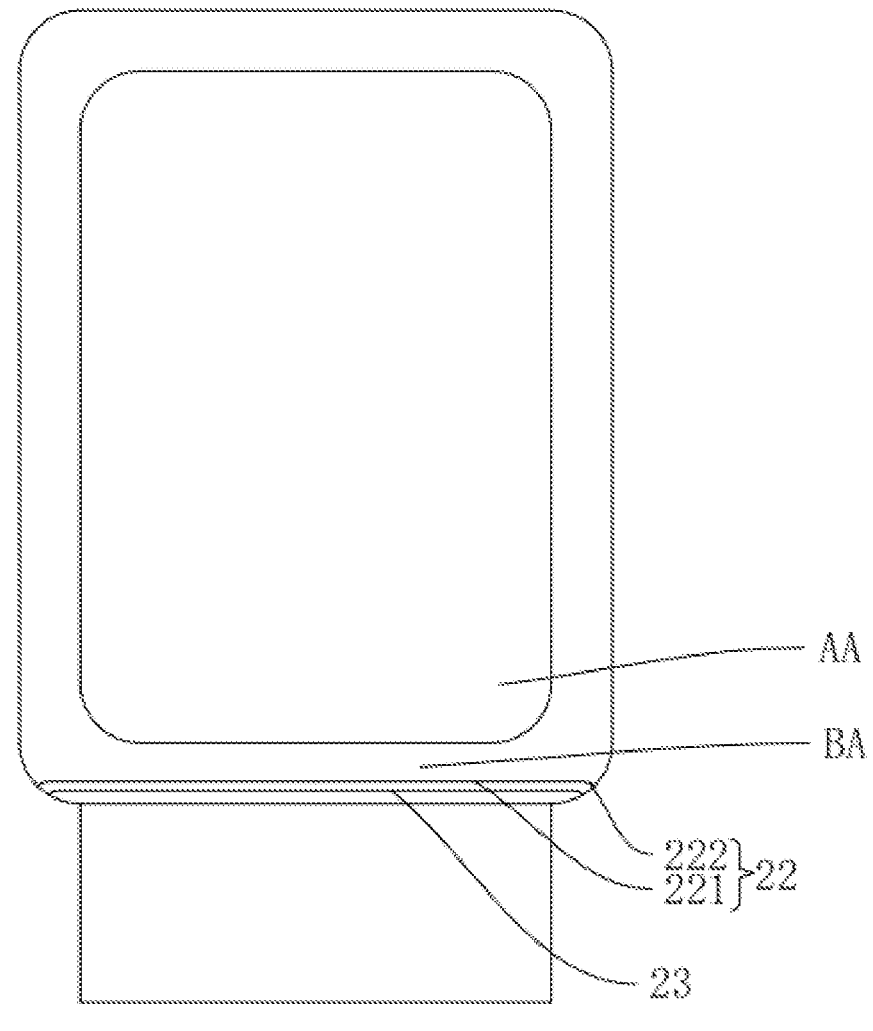
FIG. 2 is a schematic diagram of a planar structure of a display panel provided by an embodiment of the application.

Specifically, please refer to FIG. 1 and FIG. 2 together. In an embodiment of the present application, the high refractive index layer 20 further includes a second groove 23, and the second groove 23 is located on a side of the first groove 22 away from the display area AA.

In the embodiment of the present application, the lengths of the first groove 22 and the second groove 23 along the first direction X are both greater than the length of the opening 21 along the first direction X. Furthermore, in the embodiment of the present application, the sizes of the first groove 22 and the second groove 23 are configured to be larger than the size of the opening 21, so that the flow of ink during the manufacturing process can be blocked more effectively.

The high refractive index layer 30 includes a first part 32 and a second part 33 connected to both sides of the protrusion 31. The first part 32 covers the display area AA, and second part 33 extends to the non-display area BA.

The side of the first part 32 close to the low refractive index layer 20 is filled in the plurality of openings 21 to form a plurality of microlenses. The side of the first part 32 away from the low refractive index layer 20 is a flat surface, thereby improving the light-emitting effect, improving the flatness of the film layer, and facilitating the subsequent process.

Wherein, the high refractive index layer 30 covers the second groove 23, or the boundary of the high refractive index layer 30 is between the second groove 23 and the display area AA, that is, the orthographic projection of the second part 33 on the low refractive index layer 20 is located within the boundary of the second groove 23. Specifically, the second part 33 may only cover the first groove 22 and end at the first groove 22, or the second part 33 may cover the first groove 22 and the second groove 23 and end at the second groove 23. The distance between the top surface of the second part 33 and the low refractive index layer 20 decreases in a direction from the protrusion 31 to the non-display area BA. The distance between the top surface of the second part 33 and the low refractive index layer 20 is greater than the distance between the top surface of the first part 32 and the low refractive index layer 20, that is, the thickness of the first part 32 is smaller than the thickness of the second part 33.

On the other hand, the low refractive index layer 20 further includes a retaining wall structure 24 located between the first groove 22 and the second groove 23. In addition, the high refractive index layer 30 may cover the retaining wall structure 24, or the boundary of the high refractive index layer 30 is located between the retaining wall structure 24 and the display area AA.

Furthermore, the non-display area BA further includes a bending sub-area and a bonding sub-area located on the side of the bending sub-area away from the display area AA. The bending sub-area is configured to be bendable so that the part of the display panel located in the bonding sub-area can be bent to the back side of the display panel for bonding, wherein, the first groove 22 is located between the display area AA and the bending sub-area. Similarly, the second groove 23 is located between the display area AA and the bending sub-area.

It should be noted that, considering the light-emitting effect, the distance L2 from the first groove 22 to the first opening 211 along the first direction X should not be too small, and the preferred range of L2 is greater than or equal to 700 μm. Because the second groove 23 has a bonding sub-area on the side away from the display area AA, considering that the bonding process cannot be affected, L1 is greater than or equal to 1200 μm, and L1 is also greater than L2, so that the protrusion 31 can be arranged farther away from the non-display area BA. This reduction in the coverage area of the high refractive index layer 30 over the non-display area BA can reduce the border width, enabling a narrow-border display. In addition, the embodiments of the present application limit the ranges of L1, L2, and L3 to prevent the influence on the light-emitting effect and the bonding process of the display panel, and improve the yield and display effect of the display panel.

Further, both ends of the first groove 22 are in contact with the boundary of the display panel, wherein, the first groove 22 includes a first sub-groove 221 arranged perpendicular to the first direction X and second sub-grooves 222 each connected between the first sub-groove 221 and the boundary of the display panel. The second sub-grooves 222 are located on both sides of the first sub-groove 221, and the second sub-grooves 222 are arranged in a curved line.

Figure 3:
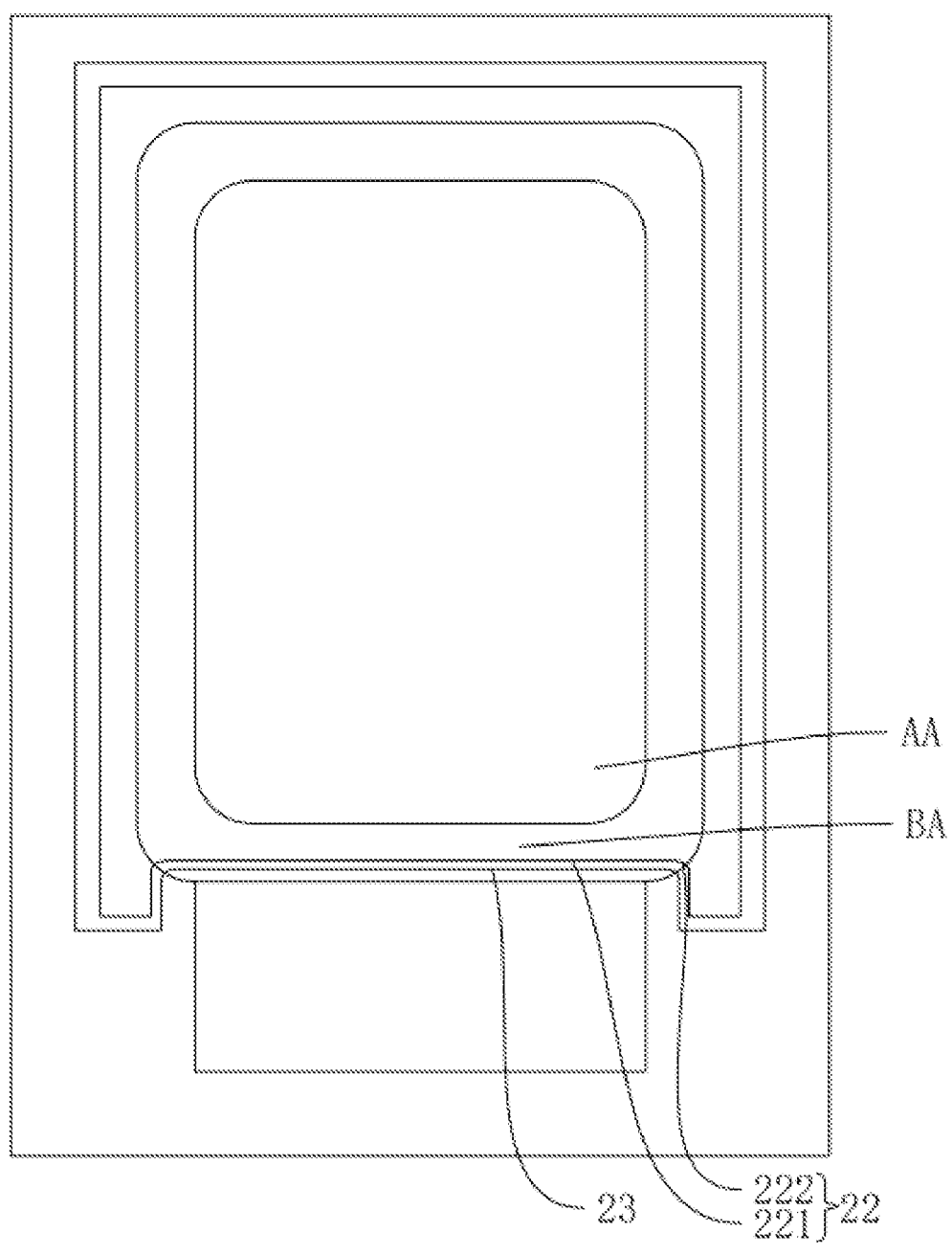
FIG. 3 is a schematic diagram of a planar structure in a two-cutting process of a display panel provided by an embodiment of the application.

Specifically, please refer to FIG. 2 and FIG. 3. The display panel shown in FIG. 2 has not been subjected to the two-cutting process, and the two-cutting line is the boundary line of the non-display area BA in the figure provided in this embodiment of the application. FIG. 3 is a plan view of the panel after the two-cutting process. In the embodiment of the present application, the Included angle between the second sub-groove 222 and the boundary of the non-display area BA ranges from 80° to 100°. This can reduce the stress on the low refractive index layer 20 during the two-cutting process and prevent the film from peeling off.

Preferably, the included angle between the second sub-groove 222 and the boundary of the non-display area BA is 90°.

It can be understood that the included angle between the first groove 22 and the boundary of the non-display area BA ranges from 80° to 100°. Similarly, the included angle between the second groove 23 and the boundary of the non-display area BA also ranges from 80° to 100° to further reduce the probability of the film peeling off.

Figure 4:
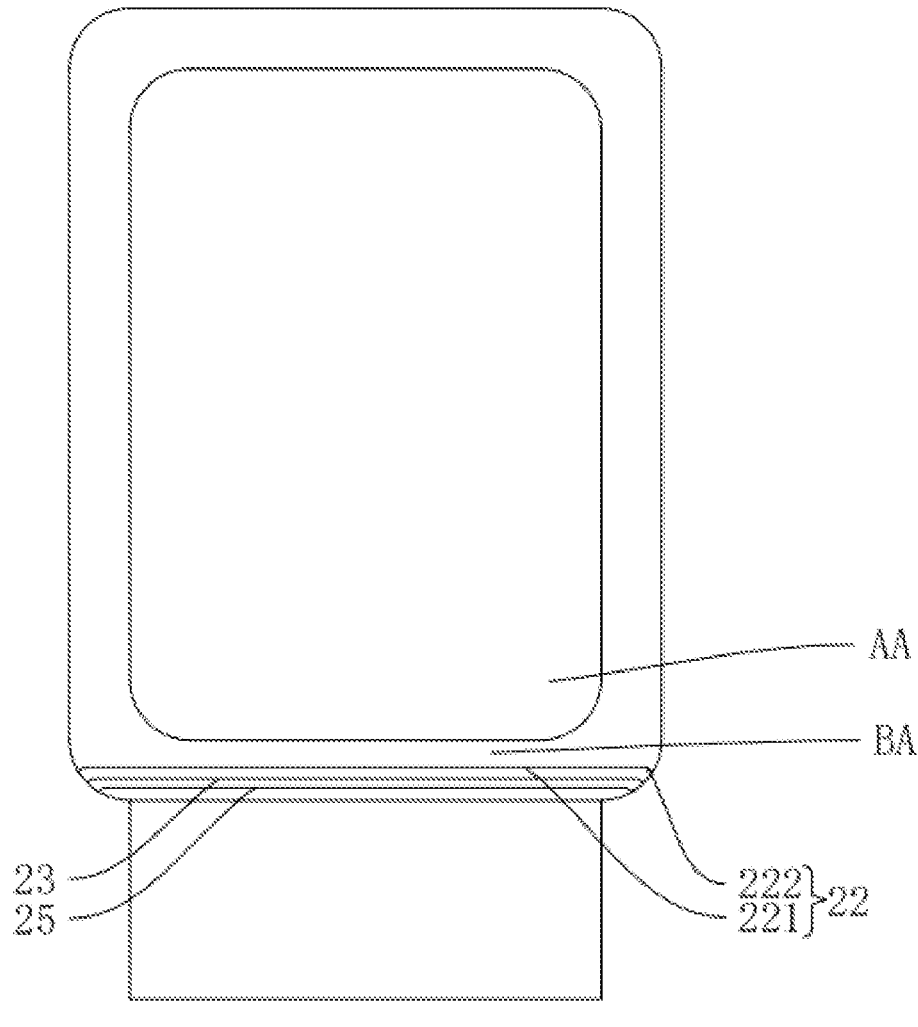
FIG. 4 is a schematic diagram of another planar structure of a display panel provided by an embodiment of the application.
Figure 5:
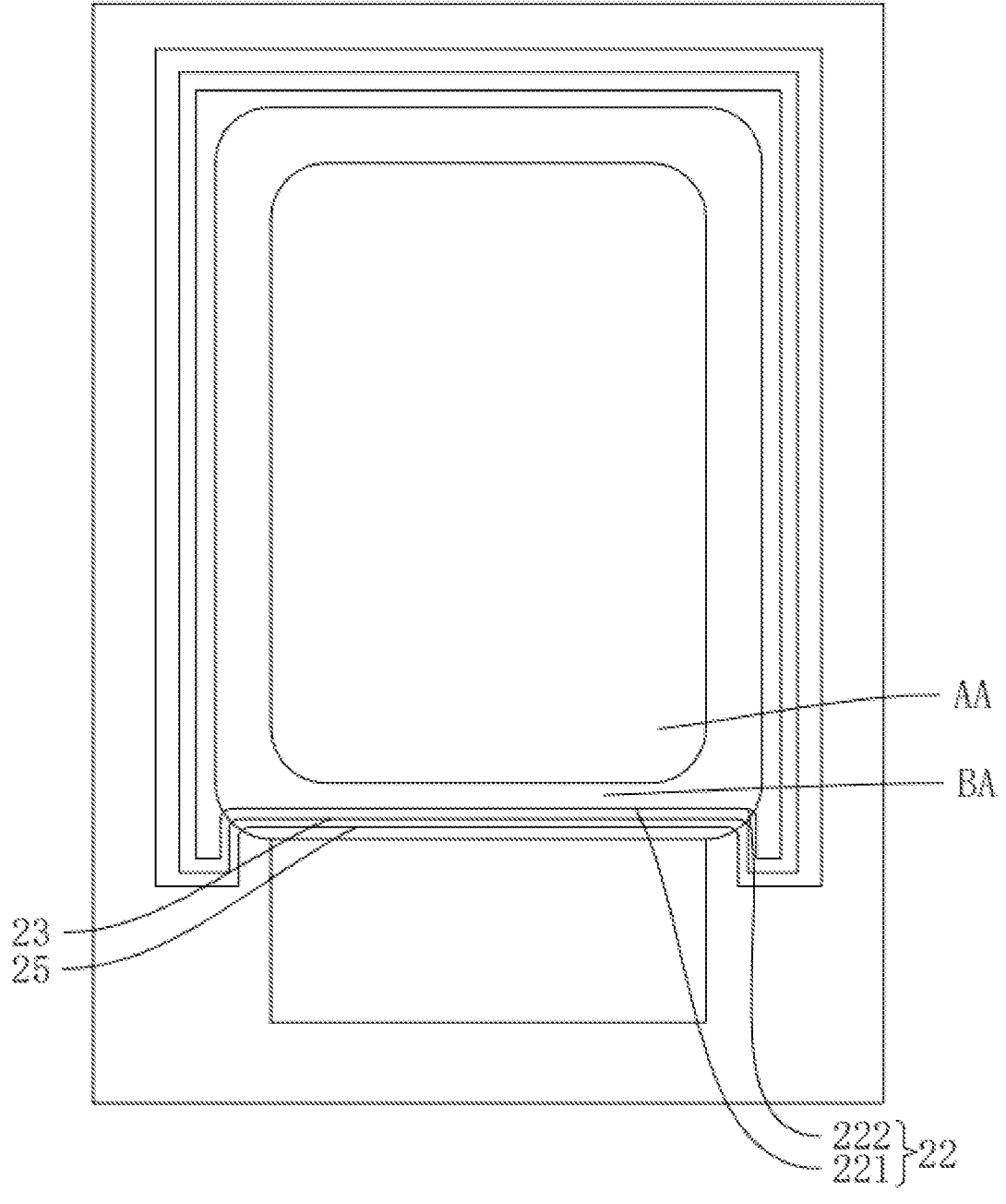
FIG. 5 is a schematic diagram of a planar structure in another two-cutting process of a display panel provided by an embodiment of the application.

Please refer to FIG. 4 and FIG. 5. In another embodiment of the present application, the difference from the aforesaid embodiment is that the low refractive index layer 20 further includes a third groove 25, and the third groove 25 is located on the side of the second groove 23 away from the display area AA.

In this embodiment, the included angle between the third groove 25 and the boundary of the non-display area BA also ranges from 80° to 100° to further reduce the probability of the film peeling off.

In conclusion, in the embodiment of the present application, the distance between the top end of the protrusion 31 and the first groove 22 is configured to be greater than the distance between the first opening 211 and the first groove 22, so that the maximum thickness formed by the edge of the film layer is located on the first opening 211 or a side of the first opening 211 close to the display area AA. This can ensure that the flat portions on the side of the protrusion 31 close to the display area AA are all located in the display area AA, and the farther the protrusion 31 is from a non-display area BA, the smaller a coverage area of a high refractive index layer 30 for the non-display area BA is, which can effectively limit the coverage area of the high refractive index layer 30, thereby saving the occupied space for the non-display area to achieve a narrow border display.

Figure 6:
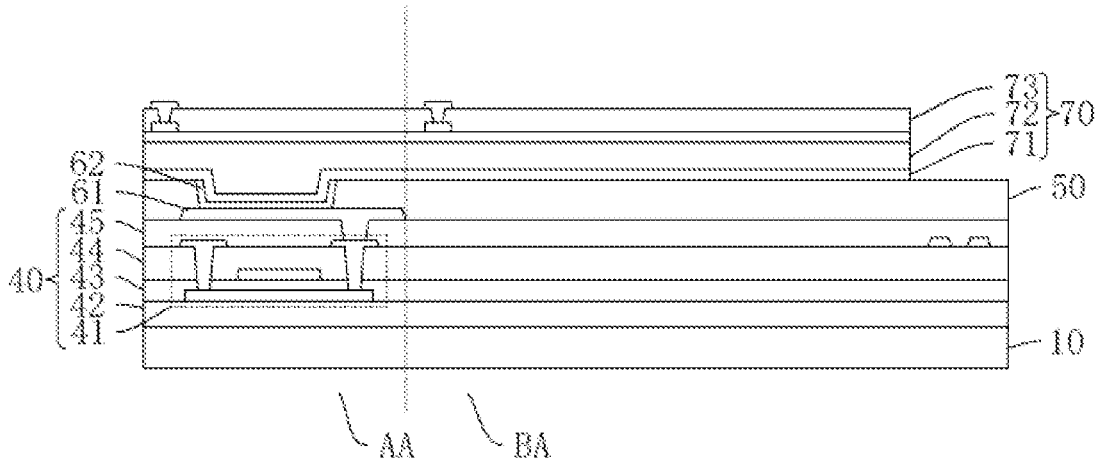
FIG. 6 is a schematic diagram of structures in a manufacturing process of a display panel provided by an embodiment of the application.
Figure 7:
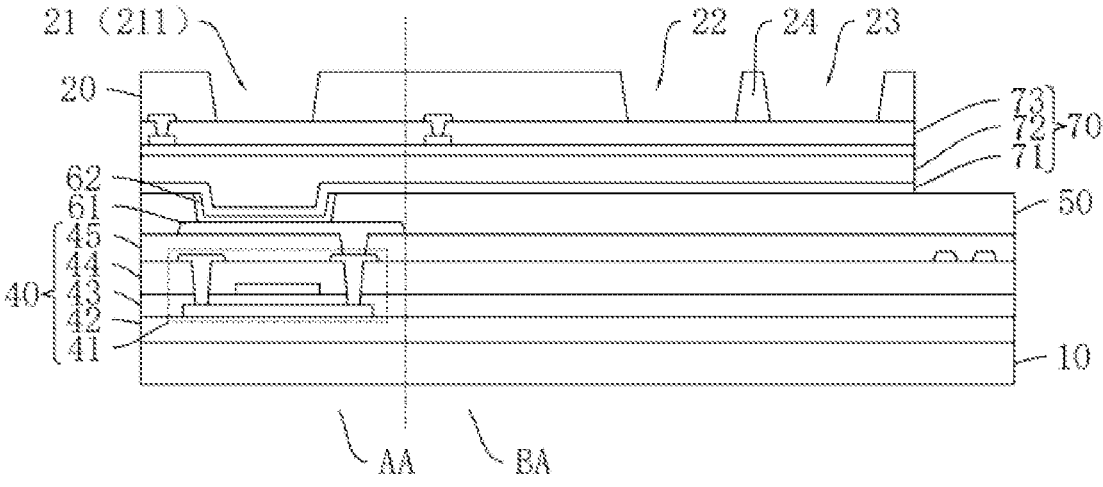
FIG. 7 is a schematic diagram of structures in a manufacturing process of a display panel provided by an embodiment of the application.

In addition, an embodiment of the present application further provides a manufacturing method of the display panel described in the foregoing embodiment. With reference to FIG. 1, FIG. 6, and FIG. 7, the manufacturing method includes the following steps: A substrate 10 is provided, and a thin film transistor array layer 40, a pixel definition layer 50, an anode 61, a light-emitting layer, an encapsulation layer 70, and a touch layer can be formed on the substrate 10 according to a conventional process. The aforesaid structures can be configured with reference to the aforesaid embodiments, and will not be repeated herein.

Then, a low refractive index layer 20 is formed on the touch layer, and the low refractive index layer 20 is patterned to form a plurality of openings 21 in the portion of the low refractive index layer 20 located in the display area AA, and a first groove 22 and a second groove 23 are formed in the portion of the low refractive index layer 20 located in the non-display area BA.

Following, a high refractive index material is used to form a high refractive index layer 30 on the low refractive index layer 20. The high refractive index layer 30 can be prepared by an inkjet printing process to form a protrusion 31 in the portion of the high refractive index layer 30 located in the display area AA.

The refractive index of the high refractive index layer 30 is greater than the refractive index of the low refractive index layer 20. For example, the refractive index of the low refractive index layer 20 ranges from 1.4 to 1.6. The material of the low refractive index layer 20 may include a light-transmitting organic material having a low refractive index. For example, acrylic resin, polyimide resin, polyamide resin, and/or Alq3 [tris(8-hydroxyquinoline)aluminum], etc. For another example, the refractive index of the high refractive index layer 30 may range from 1.61 to 1.8, and the material of the high refractive index layer 30 may include a light-transmitting organic material with a high refractive index. For example, poly(3,4-ethylenedioxythiophene) (PEDOT), 4,4'-bis[N-(3-methylphenyl)-N-phenylamino]biphenyl (TPD), 4,4',4"-Tris[(3-methylphenyl)phenylamino]triphenylamine (m-MTDATA), 1,3,5-Tris[N,N-bis(2-methylphenyl)-amino]benzene (o-MTDAB), 1,3,5-Tris[N,N-bis(3-methylphenyl)-amino]benzene (m-MTDAB), 1,3,5-Tris[N,N-bis(4-methylphenyl)amino]benzene (p-MTDAB), 4,4'-bis[N,N-bis(3-methylphenyl)-amino]diphenylmethane (BPPM), 4,4'-dicarbazolyl-1,1'-biphenyl (CBP), 4,4',4"-Tris (N-carbazole)triphenylamine (TCTA), 2,2',2"-(1,3,5-benzenetriyl)tris-[1-phenyl-1H-benzimidazole] (TPBI), and/or 3-(4-Biphenyl)-4-phenyl-5-tert-butylphenyl-1,2,4-triazole (TAZ).

Specifically, the side of the high refractive index layer 30 close to the low refractive index layer 20 is filled in the plurality of openings 21, and the plurality of openings 21 includes the first opening 211 closest to the non-display area BA, and a protrusion 31 is formed in the display area AA on the side of the high refractive index layer 30 away from the low refractive index layer 20. By controlling the process parameters, the distance between the top of the protrusion 31 and the first groove 22 is configured to be greater than the distance between the first opening 211 and the first groove 22, so that the maximum thickness formed by the edge of the film layer is located on the first opening 211 or a side of the first opening 211 close to the display area AA. This can ensure that the flat portions on the side of the protrusion 31 close to the display area AA are all located in the display area AA, and the farther the protrusion 31 is from a non-display area BA, the smaller a coverage area of a high refractive index layer 30 for the non-display area BA is. This can effectively limit the coverage area of the high refractive index layer 30, thereby saving the occupied space for the non-display area BA to achieve a narrow border display.

In the embodiment of the present application, the distance between the top end of the protrusion 31 and the first groove 22 is configured to be greater than the distance between the first opening 211 and the first groove 22 so that the maximum thickness formed by the edge of the film layer is located on the first opening 211 or a side of the first opening 211 close to the display area AA. This can ensure that the flat portions on the side of the protrusion 31 close to the display area AA are all located in the display area AA, and the farther the protrusion 31 is from a non-display area BA, the smaller a coverage area of a high refractive index layer 30 for the non-display area BA is, which can effectively limit the coverage area of the high refractive index layer 30, thereby saving the occupied space for the non-display area to achieve a narrow border display.

In the aforesaid embodiments, the description of each embodiment has its own focus. For parts that are not described in an embodiment, reference may be made to related descriptions of other embodiments.

The above describes in detail a display panel and a display device provided by the embodiments of the present application. Specific examples are used in this article to illustrate the principles and implementation of the present application, and the description of the above examples is only used to help understand the technical solutions and core ideas of this application. Those of ordinary skill in the art should understand that they can still modify the technical solutions described in the foregoing embodiments, or equivalently replace some of the technical features. These modifications or replacements do not cause the essence of the corresponding technical solutions to deviate from the scope of the technical solutions of the embodiments of the present application.

Wherein, the light-emitting layer is disposed on one side of the substrate 10, and the light-emitting layer includes a plurality of light-emitting parts 62 arranged in the display area AA. The low refractive index layer 20 is disposed on a side of the light-emitting layer away from the substrate 10, wherein the low refractive index layer 20 is defined with a plurality of openings 21 distributed in an array in the display area AA and corresponding to the plurality of light-emitting parts 62, and the low refractive index layer 20 is defined with first grooves 22 distributed in the non-display area BA. The high refractive index layer 30 is disposed on a side of the low refractive index layer 20 away from the substrate 10, wherein the high refractive index layer 30 fills the plurality of openings 21, and the high refractive index layer 30 has a protrusion 31 on a side away from the low refractive index layer 20.

Further, the plurality of openings 21 includes a first opening 211 closest to the first groove 22, and a distance from the first groove 22 to a top of the protrusion 31 in a first direction X is greater than a distance from the first groove 22 to the first opening 211 in the first direction X, and wherein the first direction X is a direction in which the non-display area BA points to the display area AA. Specifically, please refer to FIG. 1. The distance L1 from the first groove 22 to the protrusion 31 along the first direction X can be the distance from the sidewall of the first groove 22 close to the display area to the protrusion 31, and the distance L2 from the first groove 22 to the first opening 211 along the first direction X can be the distance between the sidewall of the first groove 22 close to the display area and the sidewall of the first opening 211 close to the non-display area, wherein L1 is greater than L2.

What is claimed is:

1. A display panel comprising a display area and a non-display area located on at least one side of the display area, wherein the display panel further comprises:
 a substrate;

a light-emitting layer disposed on a side of the substrate, wherein the light-emitting layer comprises a plurality of light-emitting parts arranged in the display area;
 a low refractive index layer disposed on a side of the light-emitting layer away from the substrate, wherein the low refractive index layer is defined with a plurality of openings distributed in an array in the display area and corresponding to the plurality of light-emitting parts, and the low refractive index layer is defined with a plurality of grooves distributed in the non-display area; and
 a high refractive index layer disposed on a side of the low refractive index layer away from the substrate, wherein the high refractive index layer fills the plurality of openings, and wherein a refractive index of the high refractive index layer is greater than a refractive index of the low refractive index layer, and the high refractive index layer has a protrusion on a side away from the low refractive index layer;
 wherein the plurality of openings comprises a first opening closest to a first groove of the plurality of grooves, a distance from the first groove to a top of the protrusion along a first direction is greater than a distance from the first groove to the first opening along the first direction, wherein the first direction is defined as a direction from the non-display area to the display area, and wherein both ends of the first groove extend to a boundary of the display panel and are in contact with the boundary of the display panel,
 wherein the plurality of grooves comprises a second groove, and the second groove is defined on a side of the first groove away from the display area, the lengths of the first groove and the second groove along the first direction are both greater than the length of the opening along the first direction, the sizes of the first groove and the second groove are configured to be larger than the size of the first opening.

2. The display panel of claim 1, wherein the protrusion is disposed in the display area, and an orthographic projection of the protrusion on the substrate at least partially overlap an orthographic projection of the first opening on the substrate, or the protrusion is disposed on a side of the first opening away from the non-display area.

3. The display panel of claim 2, wherein a thickness of the high refractive index layer at the protrusion is greater than a thickness of a part of the high refractive index layer other than the protrusion.

4. The display panel of claim 1, wherein the high refractive index layer covers the first groove, or a boundary of the high refractive index layer is located between the first groove and the display area.

5. The display panel of claim 4, wherein the high refractive index layer covers the second groove, or the boundary of the high refractive index layer is located between the second groove and the display area.

6. The display panel of claim 5, wherein the high refractive index layer further comprises:
 a retaining wall structure disposed between the first groove and the second groove; wherein the high refractive index layer covers the retaining wall structure, or a boundary of the high refractive index layer is located between the retaining wall structure and the display area.

7. The display panel of claim 1, wherein the high refractive index layer comprises a first part and a second part connected to both sides of the protrusion, the first part is located in the display area, and the second part extends to the non-display area, wherein a distance between a top surface of the second part and the low refractive index layer decreases in a direction from the protrusion to the non-display area, and a distance between the top surface of the second part and the low refractive index layer is greater than a distance between a top surface of the first part and the low refractive index layer.

8. The display panel of claim 7, wherein a side of the first part close to the low refractive index layer is filled in the plurality of openings, and a surface of the first part away from the low refractive index layer is a flat surface.

9. The display panel of claim 1, wherein a length of the first groove in the first direction is greater than a length of each of the plurality of openings in the first direction.

10. A display device comprising a display panel, wherein the display panel comprises a display area and a non-display area located on at least one side of the display area; and wherein the display panel further comprises:

a substrate;

a light-emitting layer disposed on a side of the substrate, wherein the light-emitting layer comprises a plurality of light-emitting parts arranged in the display area;

a low refractive index layer disposed on a side of the light-emitting layer away from the substrate, wherein the low refractive index layer is defined with a plurality of openings distributed in an array in the display area and corresponding to the plurality of light-emitting parts, and the low refractive index layer is defined with a plurality of grooves distributed in the non-display area; and a high refractive index layer disposed on a side of the low refractive index layer away from the substrate, wherein the high refractive index layer fills the plurality of openings, and wherein a refractive index of the high refractive index layer is greater than a refractive index of the low refractive index layer, and the high refractive index layer has a protrusion on a side away from the low refractive index layer;

wherein the plurality of openings comprises a first opening closest to a first groove of the plurality of grooves, a distance from the first groove to a top of the protrusion along a first direction is greater than a distance from the first groove to the first opening along the first direction, wherein the first direction is defined as a direction from the non-display area to the display area, and wherein both ends of the first groove extend to a boundary of the display panel and are in contact with the boundary of the display panel, wherein the plurality of grooves comprise a second groove, and the second groove is defined on a side of the first groove away from the display area, the lengths of the first groove and the second groove along the first direction are both greater than the length of the opening along the first direction, the sizes of the first groove and the second groove are configured to be larger than the size of the first opening.

11. The display device of claim 10, wherein the protrusion is disposed in the display area, and an orthographic projection of the protrusion on the substrate at least partially overlap an orthographic projection of the first opening on the substrate, or the protrusion is disposed on a side of the first opening away from the non-display area.

12. The display device of claim 11, wherein a thickness of the high refractive index layer at the protrusion is greater than a thickness of a part of the high refractive index layer other than the protrusion.

13. The display device of claim 10, wherein the high refractive index layer covers the first groove, or a boundary of the high refractive index layer is located between the first groove and the display area.

14. The display device of claim 13, wherein the high refractive index layer covers the second groove, or the boundary of the high refractive index layer is located between the second groove and the display area.

15. The display device of claim 14, wherein the high refractive index layer further comprises:

a retaining wall structure disposed between the first groove and the second groove; wherein the high refractive index layer covers the retaining wall structure, or a boundary of the high refractive index layer is located between the retaining wall structure and the display area.

16. The display device of claim 10, wherein the high refractive index layer comprises a first part and a second part connected to both sides of the protrusion, the first part is located in the display area, and the second part extends to the non-display area, wherein a distance between a top surface of the second part and the low refractive index layer decreases in a direction from the protrusion to the non-display area, and a distance between the top surface of the second part and the low refractive index layer is greater than a distance between a top surface of the first part and the low refractive index layer.

* * * * *